(12) United States Patent
Kim

(10) Patent No.: US 11,809,326 B2
(45) Date of Patent: Nov. 7, 2023

(54) ELECTRONIC SYSTEM INCLUDING HOST AND MEMORY SYSTEM FOR PERFORMING READ OPERATION BASED ON PHYSICAL ADDRESS RECEIVED FROM THE HOST

(71) Applicant: SK hynix Inc., Gyeonggi-do (KR)

(72) Inventor: Hyun Tae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 155 days.

(21) Appl. No.: 17/396,539

(22) Filed: Aug. 6, 2021

(65) Prior Publication Data

US 2022/0269616 A1 Aug. 25, 2022

(30) Foreign Application Priority Data

Feb. 19, 2021 (KR) .......................... 10-2021-0022531

(51) Int. Cl.
*G06F 12/00* (2006.01)
*G06F 12/10* (2016.01)
(Continued)

(52) U.S. Cl.
CPC .............. *G06F 12/10* (2013.01); *G11C 11/56* (2013.01); *G11C 16/0483* (2013.01);
(Continued)

(58) Field of Classification Search
CPC .............. G06F 12/10; G06F 2212/657; G06F 2212/1016; G06F 2212/7203; G06F 12/0246; G06F 2212/7201; G06F 3/064; G06F 3/061; G06F 3/0631; G06F 3/0652; G06F 3/0679; G06F 12/0292; G06F 3/0611; G06F 3/0647; G06F 3/0656; G06F 3/0658; G06F 3/0688; G11C 11/56; G11C 16/0483; G11C 16/14; G11C 16/26; G11C 11/5642; G11C 16/10; G11C 11/5628; G11C 2211/5641
(Continued)

(56) References Cited

U.S. PATENT DOCUMENTS

2008/0215800 A1* 9/2008 Lee ..................... G06F 12/1416
711/E12.098

FOREIGN PATENT DOCUMENTS

CN 112199038 A * 1/2021 ......... G06F 12/0253
FR 302651 * 4/2016
(Continued)

*Primary Examiner* — Mardochee Chery
(74) *Attorney, Agent, or Firm* — IP & T GROUP LLP

(57) ABSTRACT

The present technology includes a host configured to output a program request, a logical address, and data during a program operation, and a memory system configured to map a first physical address to the logical address, program the data to first memory blocks corresponding to the first physical address in a single level cell (SLC) method, program the data stored in the first memory blocks to a second memory block in a higher level cell method including a multi-level cell (MLC) method, a triple level cell (TLC) method, or a quadruple level cell (QLC) method after changing the first physical address to a second physical address, and transmit the second physical address to the host. The host outputs a read request and the second physical address to the memory system during a read operation of the data corresponding to the logical address.

20 Claims, 17 Drawing Sheets

(51) Int. Cl.
   *G11C 16/04*   (2006.01)
   *G11C 16/26*   (2006.01)
   *G11C 11/56*   (2006.01)
   *G11C 16/14*   (2006.01)
(52) U.S. Cl.
   CPC .............. *G11C 16/14* (2013.01); *G11C 16/26* (2013.01); *G06F 2212/657* (2013.01)
(58) Field of Classification Search
   USPC ........................................................ 711/206
   See application file for complete search history.

(56) References Cited

FOREIGN PATENT DOCUMENTS

| | | | |
|---|---|---|---|
| KR | 10-2015-0103532 A | | 9/2015 |
| KR | 10-2017-0081118 A | | 7/2017 |
| KR | 10-2019-0074677 A | | 6/2019 |
| KR | 20220105303 A | * | 1/2022 |
| KR | 102457564 B1 | * | 10/2022 |

* cited by examiner

ELECTRONIC SYSTEM INCLUDING HOST AND MEMORY SYSTEM FOR PERFORMING READ OPERATION BASED ON PHYSICAL ADDRESS RECEIVED FROM THE HOST

CROSS-REFERENCE TO RELATED APPLICATION

The present application claims priority under 35 U.S.C. § 119(a) to Korean patent application number 10-2021-0022531 filed on Feb. 19, 2021, the entire disclosure of which is incorporated by reference herein.

BACKGROUND

Field of Invention

The present disclosure relates to an electronic system including a memory system and a host, and more particularly, to an electronic system including a memory system configured to store or output data, and a host configured to transmit a program or read request to the memory system.

Description of Related Art

An electronic system may include a host and a memory system.

The host may be a device such as a mobile phone or a computer, and may be configured to transmit a request such as a program request, a read request, or an erase request to the memory system.

The memory system may be configured to store data or to output or erase the stored data according to the request of the host. The memory system may include a memory device in which data is stored and a controller that controls the memory device. The memory device may be classified into a volatile memory device or a nonvolatile memory device.

The volatile memory device is a memory device that stores data only when power is supplied and the stored data is destroyed when the power supply is cut off. The volatile memory device includes a static random access memory (SRAM), a dynamic random access memory (DRAM), and the like.

The nonvolatile memory device is a memory device in which data is not destroyed even though power is cut off, and includes a read only memory (ROM), a programmable ROM (PROM), an electrically programmable ROM (EPROM), an electrically erasable and programmable ROM (EEPROM), and a flash memory.

SUMMARY

An embodiment of the present disclosure provides an electronic system including a memory system and a host, which may improve a speed of a read operation performed in the memory system, by transmitting a mapped address from the memory system to the host during the program operation, and providing an address received from the host to the memory system during the read operation.

An electronic system according to an embodiment of the present disclosure includes a host configured to output a program request, a logical address, and data during a program operation, and a memory system configured to map a first physical address to the logical address, program the data to first memory blocks corresponding to the first physical address in a single level cell (SLC) method, program the data stored in the first memory blocks to a second memory block in a higher level cell method including a multi-level cell (MLC) method, a triple level cell (TLC) method, or a quadruple level cell (QLC) method after changing the first physical address to a second physical address, and transmit the second physical address to the host. The host outputs a read request and the second physical address to the memory system during a read operation of the data corresponding to the logical address.

An electronic system according to an embodiment of the present disclosure includes a host configured to output a program request for first to N-th data, and a memory system configured to program the first to N-th data to boost blocks in response to the program request, transmit a first physical address corresponding to the boost blocks to the host, and transmit, to the host, a second physical address corresponding to a user block when the first to N-th data stored in the boost blocks are moved to the user block. The host transmits a read request and the second physical address to the memory system during a read operation of the first to N-th data when the second physical address is received after storing the first physical address.

An electronic system according to an embodiment of the present disclosure includes a host configured to output a program request for data, and a memory system configured to store the data in a plurality of memory blocks, and compress and store the data stored in the plurality of memory blocks in a selected memory block other than the plurality of memory blocks. The memory system transmits a first physical address corresponding to the plurality of memory blocks according to the program request to the host, and provides a second physical address corresponding to the selected memory block to the host after compressing and storing the data. The host is configured to output, to the memory system a read request and the second physical address provided from the memory system during a read operation of the data.

An electronic system according to an embodiment of the present disclosure includes a host and a memory system including a controller and a memory device which includes multiple boost blocks and multiple user blocks, wherein the controller is configured to program multiple pieces of data from the host to boost blocks selected from among the multiple boost blocks, the selected boost blocks corresponding to a logical address from the host, and provide the host with information of a first physical address associated with the selected boost blocks, and move the multiple pieces of data to a user block selected from the multiple user blocks when a particular condition satisfies, and erase the multiple pieces of data stored in the selected boost blocks, and provide the host with information of a second physical address associated with the selected user block, wherein the controller is configured to read the multiple pieces of data from the selected user block in response to a read request for reading the multiple pieces of data and the information of the second physical address from the host and provide the host with the multiple pieces of data. The particular condition includes when a request from the host does not exist, the memory system is in an idle state, or a free block does not exist in the boost blocks.

The present technology may improve a speed of a read operation of an electronic system including a memory system and a host.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and should not be construed as limited to the embodiments set forth herein.

Figure 1:
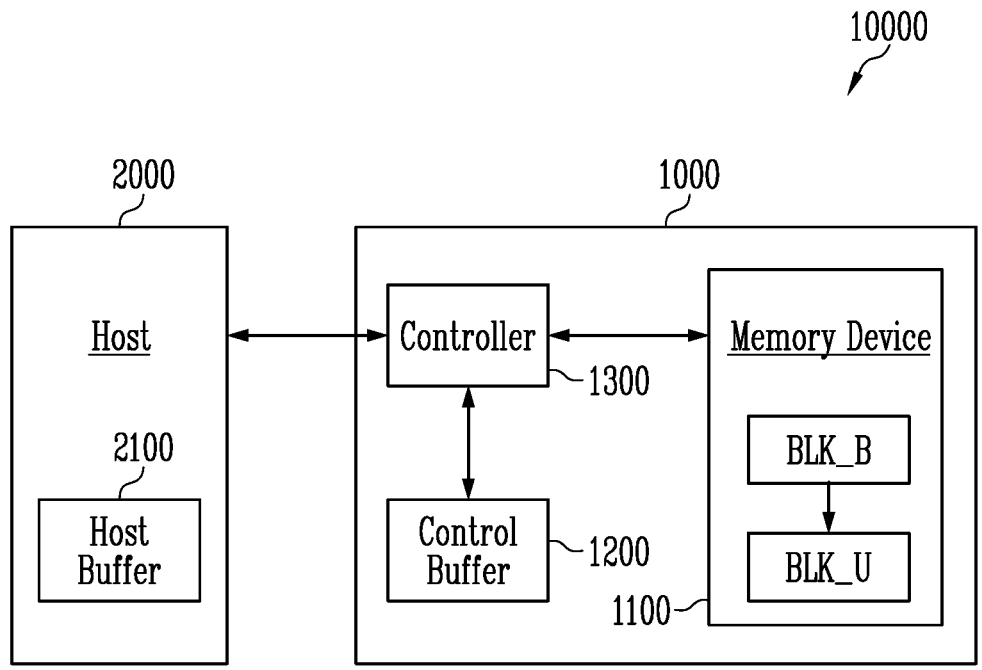
FIG. 1 is a diagram illustrating an electronic system according to an embodiment of the present disclosure.

FIG. 1 is a diagram illustrating an electronic system 10000 according to an embodiment of the present disclosure.

Referring to FIG. 1, the electronic system 10000 may include a memory system 1000 and a host 2000.

The memory system 1000 may be configured to store data or to output or erase the stored data in response to a request of the host 2000. The memory system 1000 may include a memory device 1100, a control buffer 1200, and a controller 1300.

The memory device 1100 may include memory blocks BLK_B and BLK_U configured to store data. The memory blocks BLK_B and BLK_U may be set as a boost block BLK_B and a user block BLK_U according to a program method. The boost block BLK_B may be used to quickly store data during a program operation, and may include a plurality of memory blocks. The user block BLK_U may be used to store compressed data of the data stored in the boost block BLK_B, and may include a plurality of memory blocks. The plurality of memory blocks included in the boost block BLK_B and the user block BLK_U may be configured identically to each other.

The boost block BLK_B may be set to program data in a single level cell (SLC) method, and the user block BLK_U may be set to program data in a multi-level cell (MLC) or higher level cell method. The boost block BLK_B and the user block BLK_U may be configured identically to each other structurally, and may be set so that the memory device 1100 may program or read in different methods.

The single-level cell method refers to a method in which one bit of data is stored in one memory cell, and the multi-level cell method refers to a method in which two bits of data are stored in one memory cell. Therefore, in the multi-level cell or higher level cell method, two or more bits of data may be stored in one memory cell. For example, a method in which three bits of data are stored in one memory cell may be defined as a triple level cell (TLC) method, and a method of in which four bits of data are stored in one memory cell may be defined as a quadruple level cell (QLC) method. In addition, a method in which five or more bits of data are stored in one memory cell may be used as the multi-level cell or higher level cell method.

The control buffer 1200 may be configured to store system data used in the memory system 1000. For example, the control buffer 1200 may store a map table, which is mapping information of addresses used in the host 2000 and may temporarily store data transmitted between the host 2000 and the memory device 1100. The control buffer 1200 may be configured of volatile memory cells for a fast operation speed, and may include nonvolatile memory cells according to the memory system 1000. For example, the volatile memory cells may be configured of a dynamic random access memory (DRAM) or a static random access memory (SRAM). For example, the nonvolatile memory cells may include an electrically erasable and programmable ROM (EEPROM), a NAND flash memory, a NOR flash memory, a phase-change RAM (PRAM), a resistive RAM (ReRAM), a ferroelectric RAM (FRAM), or a spin transfer torque-magnetic RAM (STT-MRAM).

The controller 1300 may be configured to control the memory device 1100 and the control buffer 1200 according to the request of the host 2000. The controller 1300 may be configured to control data transmission between the host 2000, the memory device 1100, and the control buffer 1200. The controller 1300 may map a logical address used in the host 2000 to a physical address used in the memory device 1100, and may change the mapped addresses. The controller 1300 may store the mapped address in the control buffer 1200 and may change the address stored in the control buffer 1200. In addition, the controller 1300 may be configured to transmit the addresses stored in the control buffer 1200 to the host 2000 or the memory device 1100.

The controller 1300 may perform a migration operation of moving data stored in the boost block BLK_B to the user block BLK_U, when the request of the host 2000 does not exist, the memory system 1000 is in an idle state, or a free block in which data may be stored in the boost block BLK_B does not exist. The migration operation is an operation for reducing the number of memory cells or memory blocks in which data is stored. For example, in a case where the boost block BLK_B is set in the single-level cell method and the user block BLK_U is set in the triple-level cell method, when the migration operation is performed, data stored in three memory blocks of the boost block BLK_B may be compressed to one memory block of the user block BLK_U and stored. After the data is stored in the user block BLK_U, the controller 1300 may transmit an erase command to the memory device 1100 so that the memory blocks included in the boost block BLK_B are erased. During the migration operation, the controller 1300 may generate a program command of the triple-level cell method. That is, the program command generated according to the host request may be a program command of the single-level cell method, and the program command generated during the migration operation may be the program command of the multi-level cell or higher level cell method.

The controller 1300 may store the physical address changed due to the migration operation in the control buffer 1200 and transmit the physical address stored in the control buffer 1200 to the host 2000.

The host 2000 may be a processor used in an electronic device such as a mobile phone or a computer. For example, the processor may be an application processor or a graphic processing unit, and may be configured to transmit the request such as the program request, the read request, the erase request, or the like to the memory system 1000. The host 2000 may include a host buffer 2100 for storing the physical address output from the memory system 1000. The host buffer 2100 may include volatile memory cells configured to store an address, and may include nonvolatile memory cells according to the host 2000.

During the program operation, the host 2000 may transmit the program request, the logical address, and data to the memory system 1000. The host 2000 may receive the physical address output from the controller 1300 of the memory system 1000, map the received physical address to the logical address and store the physical address in the host buffer 2100. During a read operation, the host 2000 may transmit the physical address stored in the host buffer 2100 to the controller 1300 together with the read request.

When receiving the read request and the physical address from the host 2000, the controller 1300 may generate a read command corresponding to the read request and transmit the read command and the physical address to the memory device 1100. That is, during the read operation, since the host 2000 transmits the physical address to the controller 1300, the controller 1300 may omit an operation of searching for the physical address mapped to the logical address. That is, during the read operation of the memory system 1000, since the operation of searching for the physical address mapped to the logical address is omitted, a time required for the read operation may be shortened.

Figure 2:
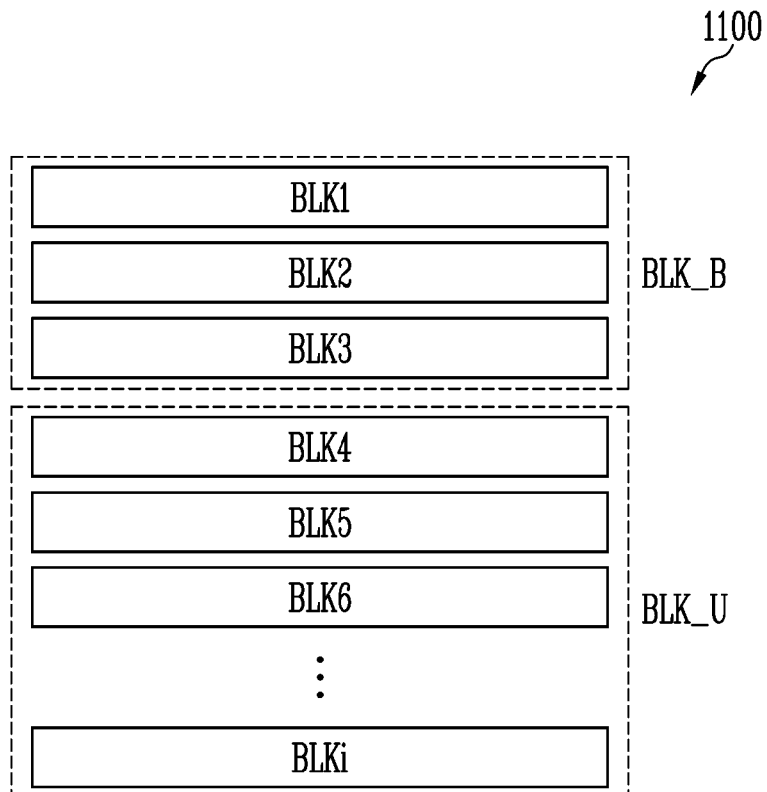
FIG. 2 is a diagram illustrating memory blocks included in a memory device according to an embodiment of the present disclosure.

FIG. 2 is a diagram illustrating memory blocks included in a memory device according to an embodiment of the present disclosure.

Referring to FIG. 2, the memory device 1100 may include first to i-th memory blocks BLK1 to BLKi capable of storing data. Each of the first to i-th memory blocks BLK1 to BLKi includes a plurality of memory cells in which data may be stored. Although not shown in the drawing, the memory device 1100 may further include peripheral circuits configured to program data in the first to i-th memory blocks BLK1 to BLKi, or to output or erase the programmed data.

Each of the first to i-th memory blocks BLK1 to BLKi may be configured identically to each other, but may be divided into the boost block BLK_B or the user block BLK_U according to a program method.

The boost block BLK_B is a block used to quickly program data according to the request of the host, and the user block BLK_U is a block used during the migration operation to increase a storage capacity. For example, the boost block BLK_B may be set to program or read data in a single-level cell method, and the user block BLK_U may be set to program or read data in a multi-level cell or higher level cell method. Therefore, as the number of memory blocks set as the user block BLK_U among the first to i-th memory blocks BLK1 to BLKi increases, the storage capacity of the memory device 1100 may increase.

Figure 3:
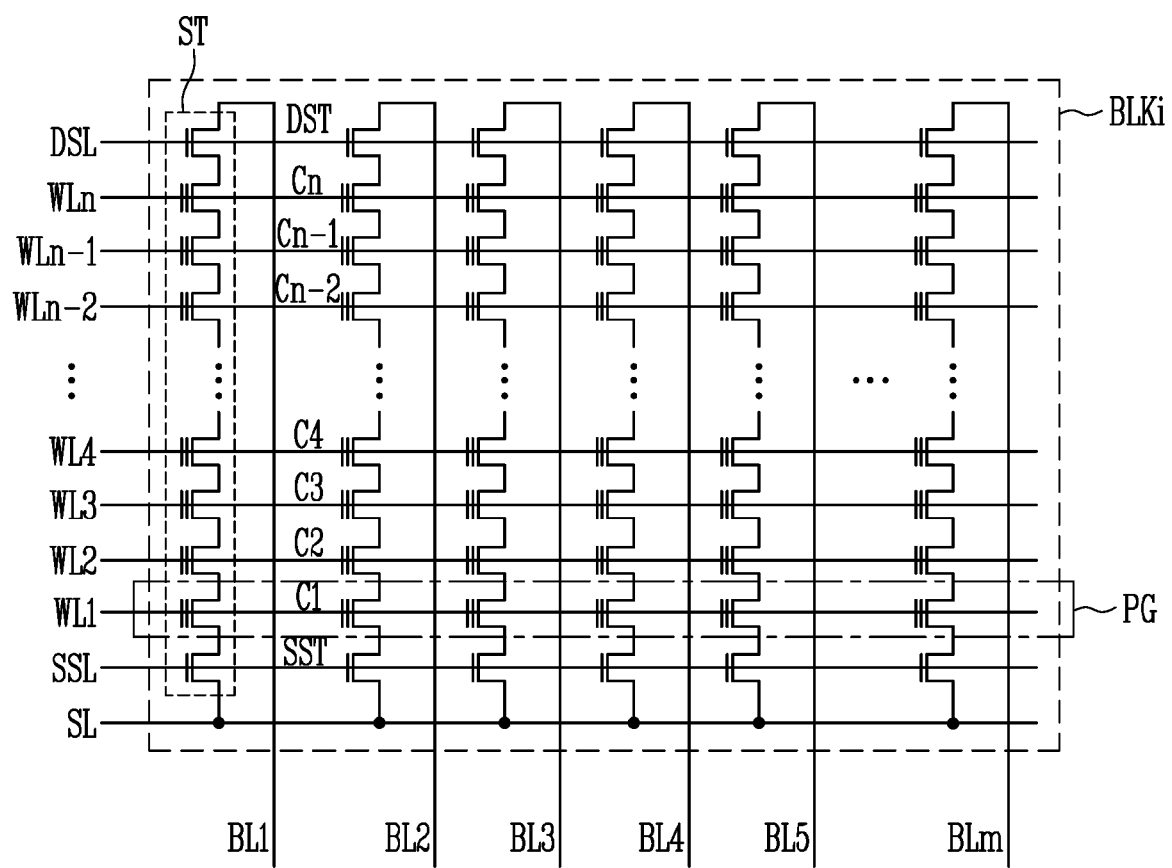
FIG. 3 is a diagram illustrating a memory block shown in FIG. 2 according to an embodiment of the present disclosure.

FIG. 3 is a diagram illustrating the memory block shown in FIG. 2 according to an embodiment of the present disclosure.

Since the plurality of memory blocks BLK1 to BLKi shown in FIG. 2 are configured identically to each other, the i-th memory block BLKi is described as an example.

Referring to FIG. 3, an i-th memory block BLKi may include a plurality of strings ST connected between first to m-th bit lines BL1 to BLm (where m is a positive integer) and a source line SL. Each of the strings ST may include a source select transistor SST, the first to n-th memory cells C1 to Cn, and a drain select transistor DST connected in series between the source line SL and the first to m-th bit lines BL1 to BLm.

Since FIG. 3 is a diagram illustrating a configuration of the memory block, the number of source select transistors SST, first to n-th memory cells C1 to Cn, and drain select transistors DST is not limited to the number shown in FIG. 3.

Gates of the source select transistors SST connected to different strings ST may be connected to a source select line SSL. Gates of each of the first to n-th memory cells C1 to Cn may be connected to first to n-th word lines WL1 to WLn. Gates of the drain select transistors DST may be connected to a drain select line DSL.

A group of memory cells connected to the same word line and included in different strings ST may configure one page PG. The program operation and the read operation may be performed in a unit of the page PG.

Figure 4:
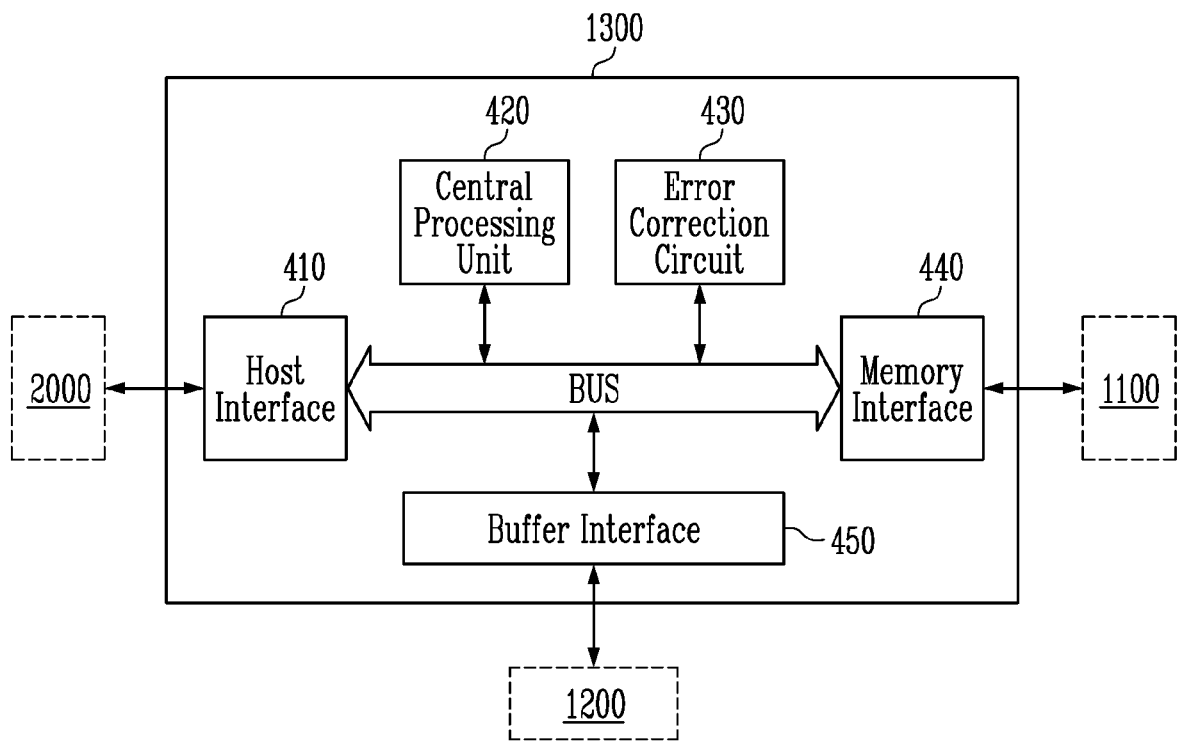
FIG. 4 is a diagram illustrating a controller according to an embodiment of the present disclosure.

FIG. 4 is a diagram illustrating a controller 1300 according to an embodiment of the present disclosure.

Referring to FIG. 4, the controller 1300 may include a host interface 410, a central processing unit 420, an error correction circuit 430, a memory interface 440, and a buffer interface 450. The host interface 410, the central processing unit 420, the error correction circuit 430, the memory interface 440, and the buffer interface 450 may exchange information with each other through a bus.

The host interface 410 may be configured to transmit information between the host 2000 and the controller 1300. For example, during the program operation, the host interface 410 may receive the program request, the logical address, and data output from the host 2000, and transmit the program request to the central processing unit 420 under control of the central processing unit 420, and transmit the logical address and the data to the buffer interface 450. During the migration operation, the host interface 410 may output the physical address received through the bus to the host 2000 under the control of the central processing unit 420. During the read operation, the host interface 410 may receive the read request and the physical address from the host 2000 and transmit the read request and the physical address to the central processing unit 420 under the control of the central processing unit 420. In addition, during the read operation, the host interface 410 may output the data received through the bus to the host 2000 under the control of the central processing unit 420.

The central processing unit 420 may be configured to control the host interface 410, the error correction circuit 430, the memory interface 440, and the buffer interface 450, and to map addresses to each other or search for the mapped addresses. For example, when the program operation is performed in response to the program request output from the host 2000, the central processing unit 420 may generate the program command set in the single-level cell method and transmit the program command to the memory interface 440. During the migration operation, the central processing unit 420 may generate the read command set in the single-level cell method and transmit the read command to the memory interface 440. Subsequently, the central processing unit 420 may generate the program command set in the triple-level cell method and transmit the program command to the memory interface 440. The central processing unit 420 may generate an erase command for erasing the memory blocks programmed in the single-level cell method after performing the program operation according to the triple-level cell method. Subsequently, the central processing unit 420 may transmit the erase command to the memory interface 440. During the read operation performed in response to the read request output from the host 2000, the central processing unit 420 may generate the read command set in the triple-level cell method and transmit the read command to the memory interface 440.

The error correction circuit 430 may be configured to perform an error correction encoding operation using data received from the host interface 410 and an error correction code during the program operation. Further, the error correction circuit 430 may be configured to detect or correct an error by decoding data received from the memory interface 440 during the read operation.

The memory interface 440 may be configured to transmit information between the controller 1300 and the memory device 1100. For example, the memory interface 440 may be configured to transmit the program command, the physical address, and the data received through the bus to the memory device 1100 during the program operation. The memory interface 440 may be configured to transmit the data received from the memory device 1100 to the buffer interface 450 through the bus during the read operation.

The buffer interface 450 may be configured to transmit information between the controller 1300 and the control buffer 1200. For example, the buffer interface 450 may be configured to transmit addresses or data transmitted through the bus to the control buffer 1200, and configured to transmit the addresses or the data stored in the control buffer 1200 through the bus.

Figure 5:
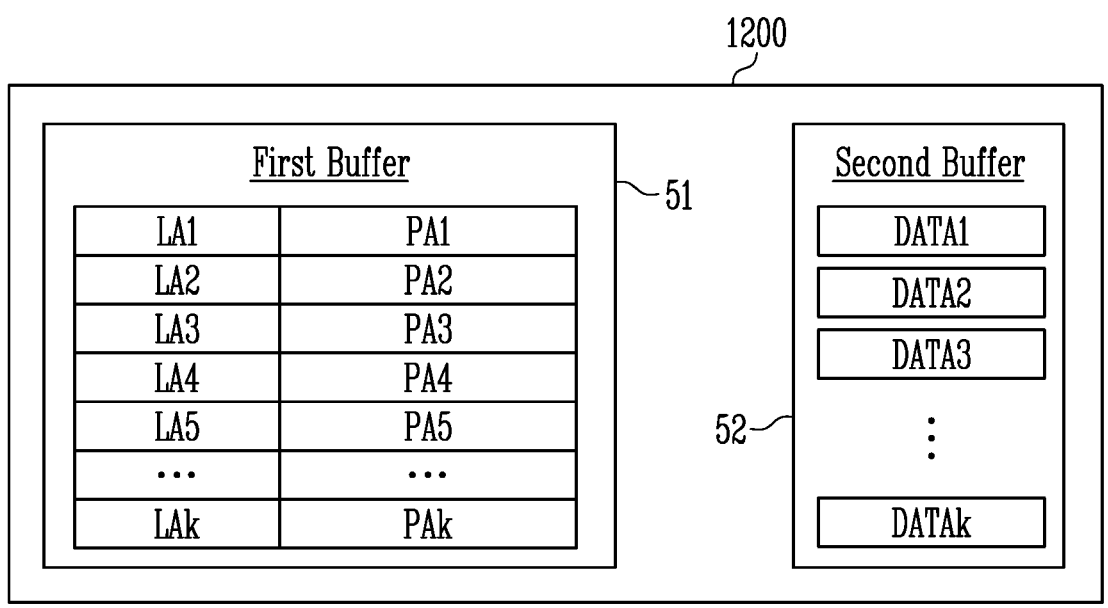
FIG. 5 is a diagram illustrating a control buffer according to an embodiment of the present disclosure.

FIG. 5 is a diagram illustrating a control buffer 1200 according to an embodiment of the present disclosure.

Referring to FIG. 5, the control buffer 1200 may include a first buffer 51 for storing the addresses and a second buffer 52 for temporarily storing the data during the program or read operation.

The first buffer 51 may be configured to store logical addresses LA1 to LAk (where k is a positive integer) and physical addresses PA1 to PAk which are mapped by the central processing unit 420 of FIG. 4. For example, the first physical address PA1 may be mapped to the first logical address LA1, the second physical address PA2 may be mapped to the second logical address LA2, and the k-th physical address PAk may be mapped to the k-th logical address LAk. When the logical address or the physical address is changed or the logical address and the physical address are changed by the central processing unit 420 of FIG. 4, either or both of a changed logical address and a physical address may be stored in the first buffer 51.

The second buffer 52 may be configured to temporarily store data DATA1 to DATAk received from the host 2000 of FIG. 4 during the program operation. The second buffer 52 may be configured to temporarily store the data DATA1 to DATAk received from the memory device 1100 of FIG. 4 during the read operation. For example, when the first to third data DATA1 to DATA3 are received from the host 2000 of FIG. 4 during the program operation, the first to third data DATA1 to DATA3 received through the bus may be temporarily stored in the second buffer 52. During the program operation, the data temporarily stored in the second buffer 52 may be stored until the program operation of the memory device 1100 of FIG. 4 is completed.

Figure 6:
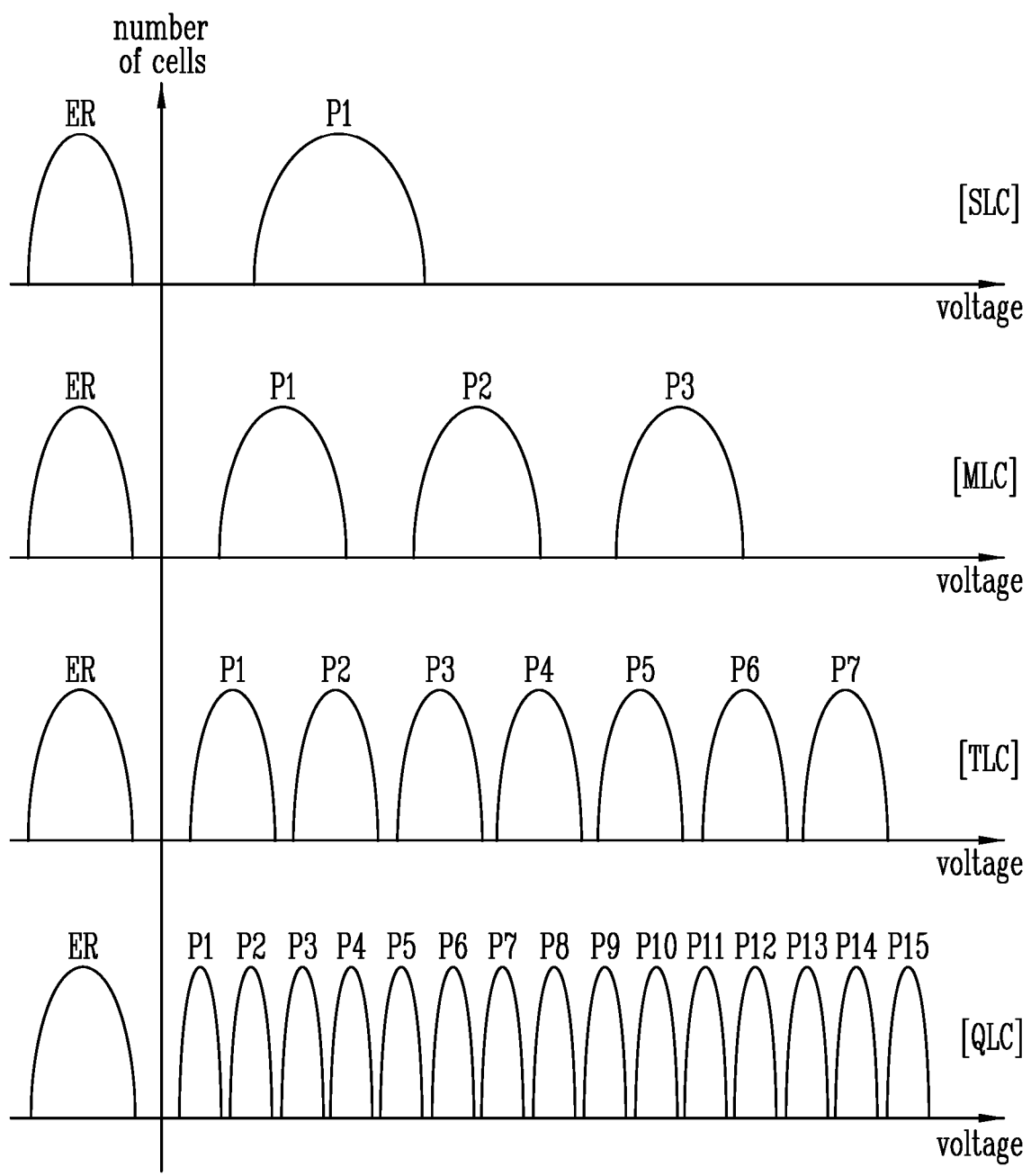
FIG. 6 is a diagram illustrating a threshold voltage distribution of memory cells according to an embodiment of the present disclosure.

FIG. 6 is a diagram illustrating a threshold voltage distribution of memory cells according to an embodiment of the present disclosure.

Referring to FIG. 6, threshold voltage distributions of memory cells for each of a single level cell (SLC) method, a multi-level cell (MLC) method, a triple level cell (TLC) method, and a quadruple level cell (QLC) method are shown. In the SLC method, the memory cells may be an erase state ER or may be programmed to a first program state P1 according to one bit of data. In the MLC method, the memory cells may be an erase state ER or may be programmed to a first program state P1, a second program state P2, or a third program state P3 according to two bits of data including least significant bit (LSB) data and most significant bit (MSB) data. The LSB and MSB data may be different logical page data and may be stored in one physical page. For example, the LSB data may be stored in a selected page as a low rank bit data, and the MSB data may be stored in a selected page as a high rank bit data. Therefore, each of the memory cells included in the selected page may be the erase state ER, the first program state P1, the second program state P2, or the third program state P3 according to a combination of the LSB data and the MSB data. In the TLC method, the memory cells may be an erase state ER or may be programmed to any of first to seventh program states P1 to P7 according to three bits of data including LSB data, central significant bit (CSB) data, and MSB data. In the QLC method, the memory cells may be an erase state ER or may be programmed to any one of the first to fifteenth program states P1 to P15 according to four bits of data including LSB data, first CSB data, second CSB data, and MSB data.

Figure 7:
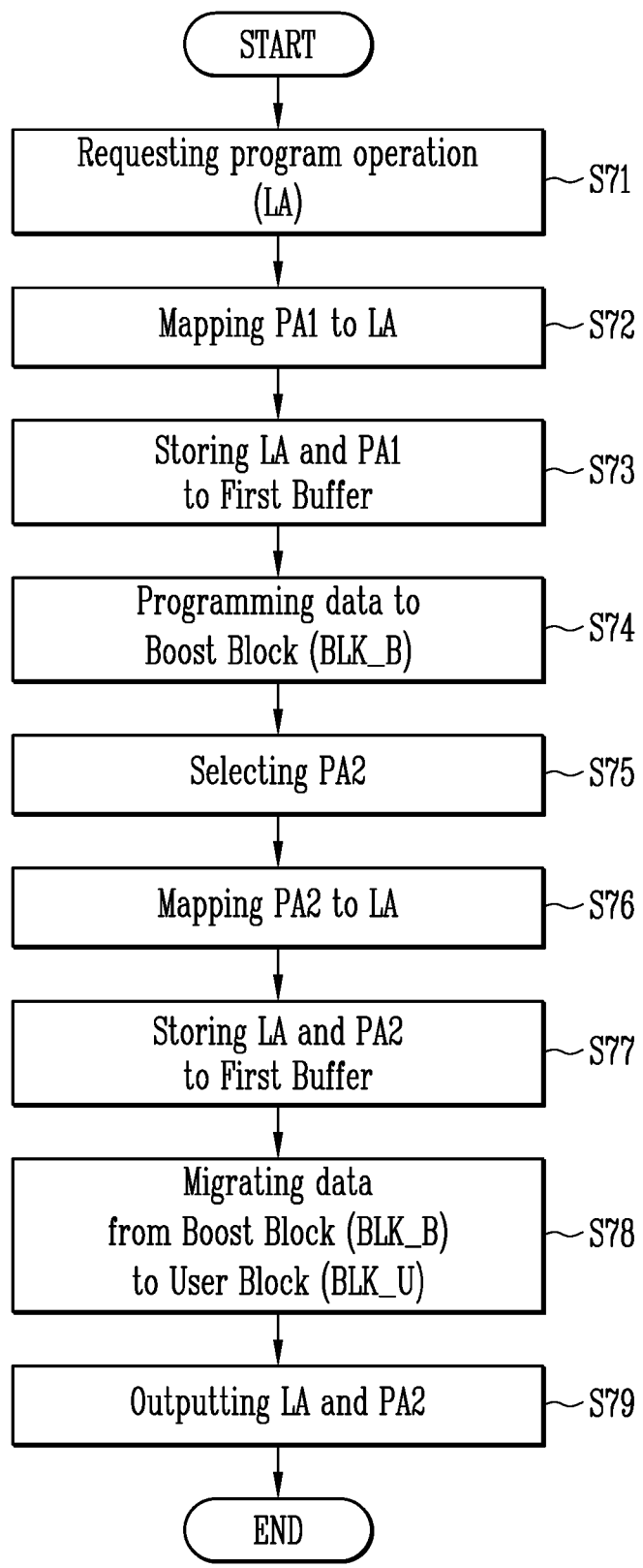
FIG. 7 is a flowchart illustrating a program operation according to an embodiment of the present disclosure.

FIG. 7 is a flowchart illustrating a program operation according to an embodiment of the present disclosure.

Referring to FIG. 7, the host 2000 of FIG. 4 may transmit the program request for the program operation to the controller 1300 of FIG. 4 (S71). For example, when transmitting the program request to the controller 1300, the host 2000 may transmit the data and the logical address LA for a region to which the data is to be programmed to the controller 1300 together.

When the program request, the logical address, and the data are received, the controller 1300 may select the first physical address PA1 of the memory device 1100 according to a size of the data, and map the first physical address PA1 to the logical address LA (S72). For example, the first physical address PA1 may be an address of one or more free blocks selected from among the memory blocks included in the boost block BLK_B of the memory device 1100.

The controller 1300 may store the logical address LA and the first physical address PA1 mapped to each other in the first buffer 51 of the control buffer 1200 of FIG. 5 (S73).

The controller 1300 may generate the program command corresponding to the program request, transmit the program command, the first physical address PA1, and the data to the memory device 1100, and the memory device 1100 may program the data to the boost block BLK_B corresponding to the physical address PA1 (S74). The program command may be a command of the SLC method. The boost block BLK_B may be a block set so that the data is read in the SLC method. When the data is programmed to the boost block BLK_B, the controller 1300 may output a program completion signal to the host 2000. When the program completion signal is input, the host 2000 may determine that the program operation for the program request is completed.

When the program operation of the boost block BLK_B is completed and a particular condition satisfied, the controller 1300 may select the second physical address PA2 of the selected free block from among the memory blocks included in the user block BLK_U (S75). In some embodiments, the particular condition may include when it is determined that the request of the host 2000 does not exist, the memory system 1000 is in the idle state, or the free block in which the data may be stored in the boost block BLK_B does not exist. The user block BLK_U may be a block set in the MLC, TLC, or QLC method, and in the present embodiment, the user block BLK_U set in the TLC method is described as an embodiment.

The controller 1300 may map the second physical address PA2 to the logical address LA (S76).

The controller 1300 may store the logical address LA and the second physical address PA2 mapped to each other in the first buffer 51 of the control buffer 1200 (S77).

The controller 1300 may perform the migration operation of moving the data stored in the boost block BLK_B to the user block BLK_U (S78). For example, the controller 1300 may read the data of the boost block BLK_B and program the read data to the user block BLK_U in the TLC method.

More specifically, the controller 1300 may transmit the first physical address PA1 and the read command stored in the first buffer 51 to the memory device 1100, and the memory device 1100 may perform the read operation of the boost block BLK_B to which the first physical address PA1 is allocated. Since the boost block BLK_B is the block set in the SLC method, the controller 1300 may output the read command of the SLC method to the memory device 1100. The memory device 1100 may output the data read from the boost block BLK_B to the controller 1300. The controller 1300 may temporarily store the data received from the memory device 1100, and transmit the program command, the second physical address PA2, and the data to the memory device 1100. The memory device 1100 may perform the program operation on the user block BLK_U to which the second physical address PA2 is allocated. Since the user block BLK_U is the block set in the TLC method, the controller 1300 may transmit the program command of the TLC method to the memory device 1100 when transmitting the data for a program to the memory device 1100.

When the program operation of the user block BLK_U is completed, the controller 1300 may transmit the logical address LA and the second physical address PA2 stored in the first buffer 51 to the host 2000 (S79). The host 2000 may receive the logical address LA and the second physical address PA2 output from the controller 1300, and store the received logical address LA and second physical address PA2 in the host buffer 2100 of FIG. 1.

Operations performed in the above-described program operation are specifically described using the host 2000, the controller 1300, the control buffer 1200, and the memory device 1100 as follows.

FIGS. 8A to 8G are diagrams illustrating a program operation for each step according to an embodiment of the present disclosure.

Figure 8A:
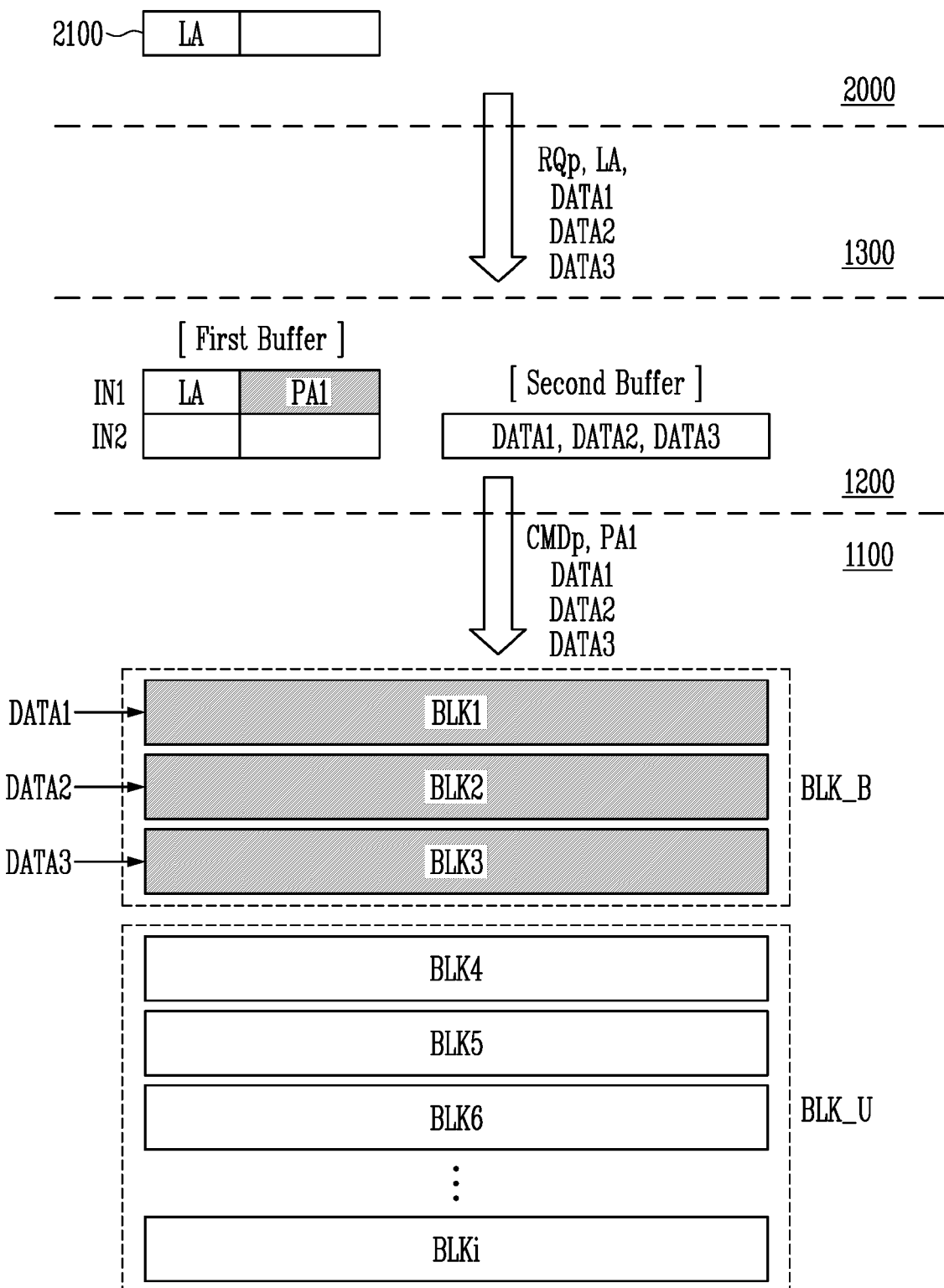
FIGS. 8A to 8G are diagrams illustrating a program operation for each step according to an embodiment of the present disclosure.

Referring to FIG. 8A, in order to program the first to third data DATA1 to DATA3, the host 2000 may transmit a program request RQp, the logical address LA, and the first to third data DATA1 to DATA3 to the controller 1300. At this time, the host 2000 may store the logical address LA in the host buffer 2100.

The controller 1300 generates a program command CMDp according to the program request RQp, and temporarily stores the first to third data DATA1 to DATA3 in the second buffer 52 of the control buffer 1200. The program command CMDp generated according to the request of the host 2000 may be the program command of the SLC method.

The controller 1300 may map the first physical address PA1 of a region in which the first to third data DATA1 to DATA3 may be stored to the logical address LA, and store the logical address LA and the first physical address PA1 mapped to each other in the first buffer 51 of the control buffer 1200. For example, the logical address LA and the first physical address PA1 may be stored in a region corresponding to a first index IN1 of the first buffer 51.

The controller 1300 may transmit the program command CMDp, the first physical address PA1, and the first to third data DATA1 to DATA3 to the memory device 1100.

The memory device 1100 may program the first to third data DATA1 to DATA3 in the boost block BLK_B corresponding to the first physical address PA1 in response to the program command CMDp. For example, the first data DATA1 may be programmed to the first memory block BLK1 included in the boost block BLK_B, the second data DATA2 may be programmed to the second memory block BLK2 included in the boost block BLK_B, and the third data DATA3 may be programmed to the third memory block BLK3 included in the boost block BLK_B.

Since the program command CMDp is the command of the SLC method, the memory device 1100 may program the first to third data DATA1 to DATA3 to the first to third memory blocks BLK1 to BLK3 in the SLC method. In the program operation of the SLC method, one bit of data may be stored in one memory cell. That is, AA memory cells (where AA is a positive integer) are included in the first memory block BLK1, the first data DATA1 stored in the first memory block BLK1 may have a size of AA bits. Each of the remaining second and third memory blocks BLK2 and BLK3 may also include AA memory cells. Therefore, a total capacity of the first to third data DATA1 to DATA3 may be 3×AA.

Figure 8B:
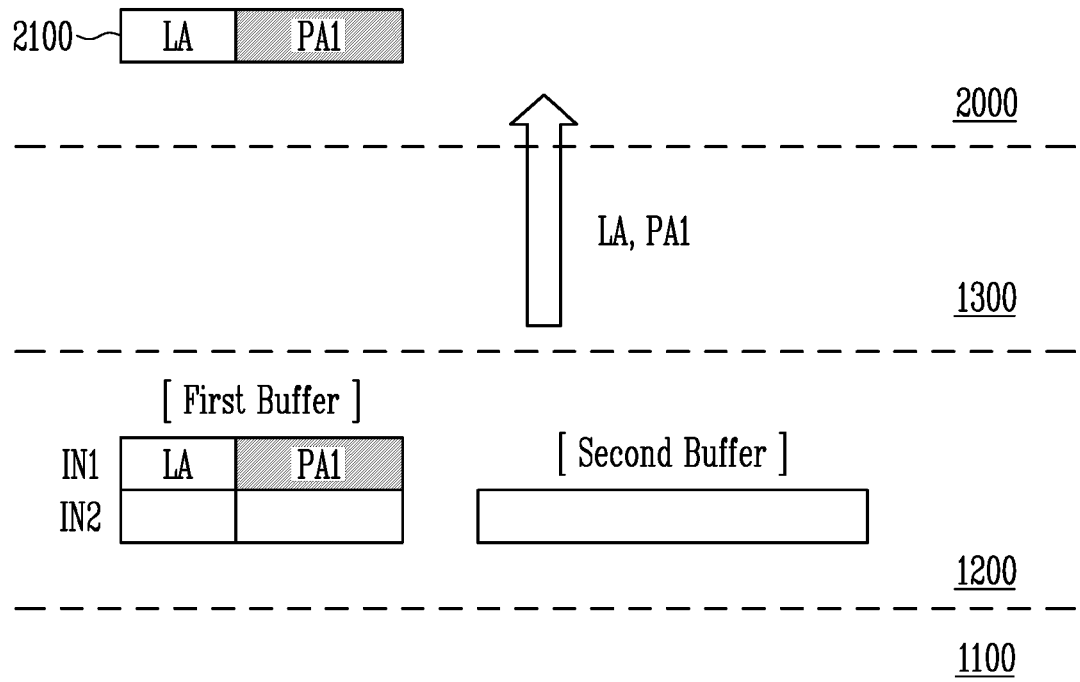
Figure 8B:
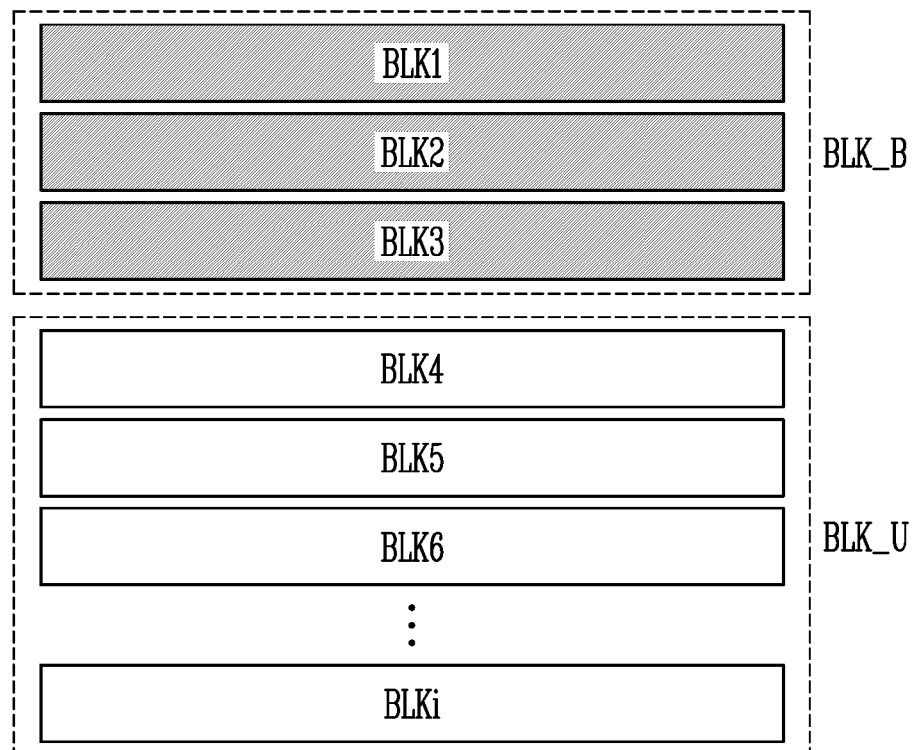

Referring to FIG. 8B, when the first to third data DATA1 to DATA3 are programmed to the first to third memory blocks BLK1 to BLK3, the controller 1300 may initialize the second buffer 52 included in the control buffer 1200, and transmit the logical address LA and the first physical address PA1 stored in the first buffer 51 to the host 2000. That is, before the migration operation is performed, the host 2000 may output the read request for the first to third data DATA1 to DATA3, and thus the controller 1300 may transmit the first physical address PA1 of the memory blocks in which the first to third data DATA1 to DATA3 are stored and the logical address LA mapped to the first physical address PA1 to the host 2000.

When the logical address LA and the first physical address PA1 are input, the host 2000 may store the first physical address PA1 in a region corresponding to the logical address LA in the host buffer 2100.

Figure 8C:
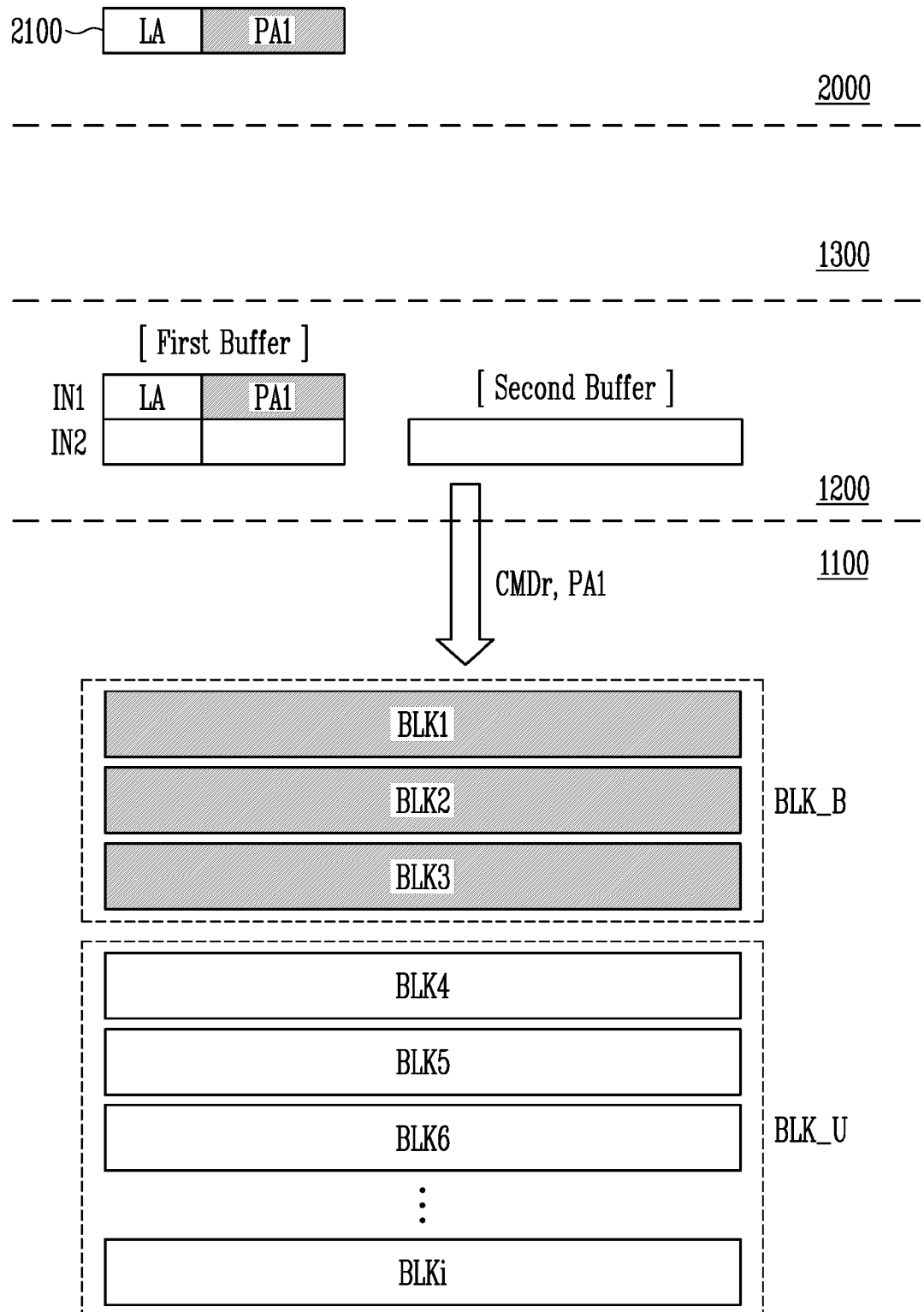

Referring to FIG. 8C, the controller 1300 may perform the migration operation when it is determined that the request output from the host 2000 does not exist, the memory device 1100 is in the idle state, or the free block in which data may be stored in the boost block BLK_B does not exist.

When the migration operation is started, the controller 1300 may transmit a read command CMDr and the first physical address PA1 to the memory device 1100. The read command CMDr may be set in the same method as the program operation for the first physical address PA1. For example, when the program operation for the first physical address PA1 is performed in the SLC method, the read command CMDr may also be the read command of the SLC method.

Figure 8D:
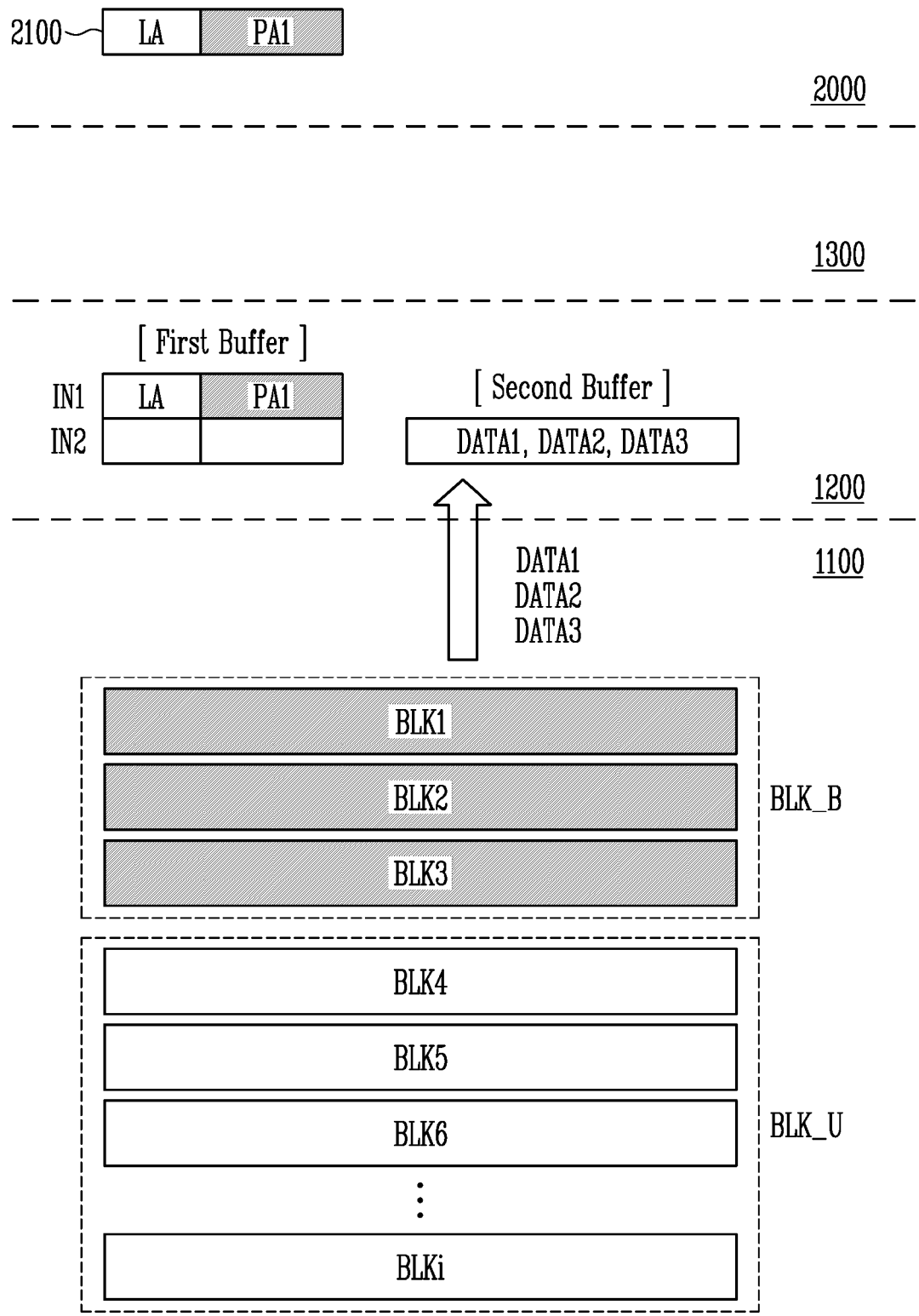

Referring to FIG. 8D, in response to the read command CMDr and the first physical address PA1, the memory device 1100 may perform the read operation of the first to third memory blocks BLK1 to BLK3 included in the boost block BLK_B. For example, since the first to third memory blocks BLK1 to BLK3 are allocated to the first physical address PA1, the memory device 1100 may perform the read operation on each of the first to third data DATA1 to DATA3, and output the read first to third data DATA1 to DATA3.

The controller 1300 may temporarily store the first to third data DATA1 to DATA3 output from the memory device 1100 in the second buffer 52.

Figure 8E:
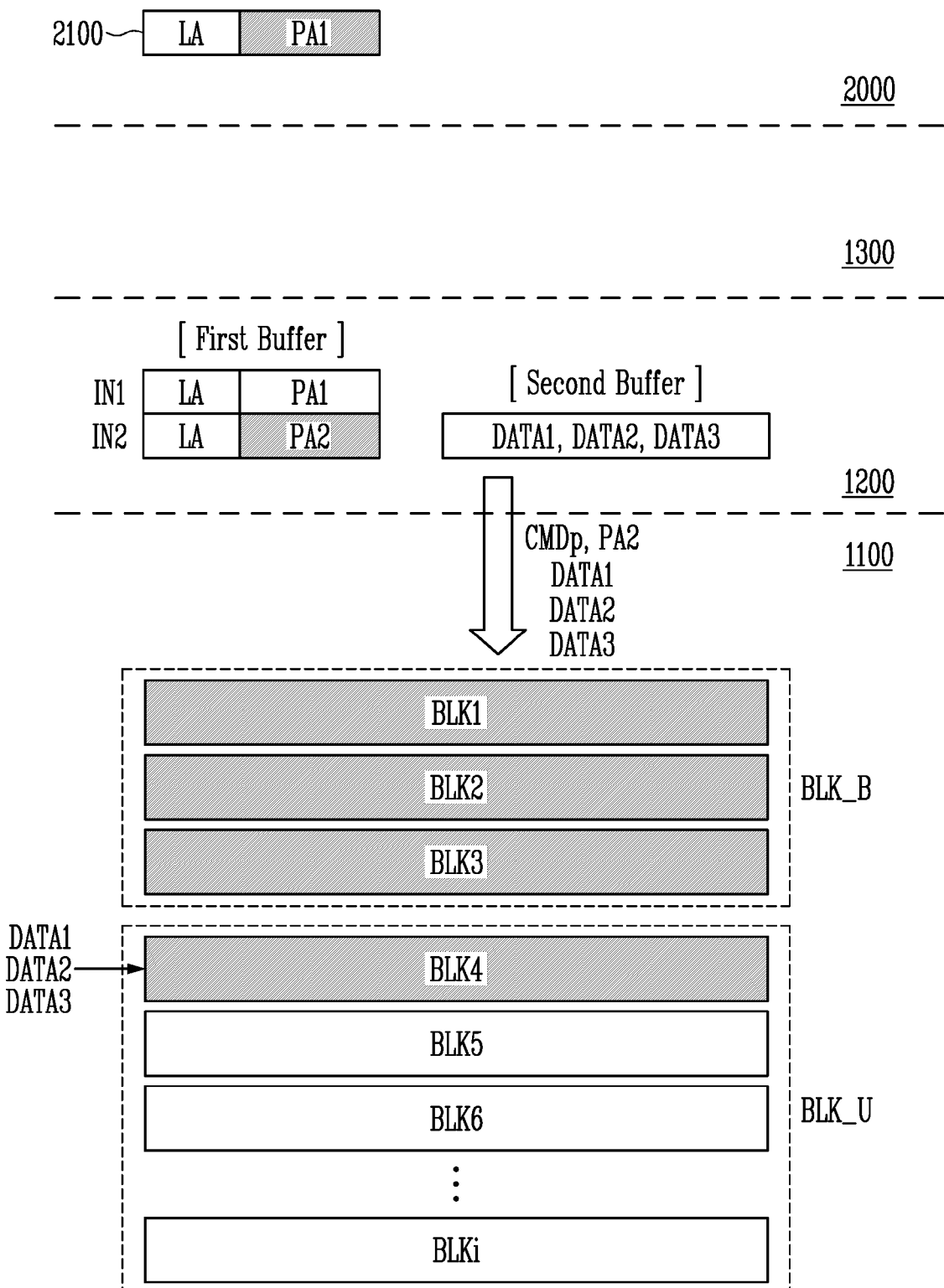

Referring to FIG. 8E, the controller 1300 may select the second physical address PA2 corresponding to the user block BLK_U, and store the logical address LA and the second physical address PA2 in a region corresponding to a second index IN2 of the first buffer 51.

The controller 1300 may generate the program command CMDp of the TLC method, and transmit the program command CMDp, the second physical address PA2, and the first to third data DATA1 to DATA3 to the memory device 1100. For example, the controller 1300 may transmit the second physical address PA2 stored in the first buffer 51 and the first to third data DATA1 to DATA3 stored in the second buffer 52 to the memory device 1100.

The memory device 1100 may program the first to third data DATA1 to DATA3 to the user block BLK_U corresponding to the second physical address PA2 in response to the program command CMDp. For example, the first to third data DATA1 to DATA3 may be programmed to the fourth memory block BLK4 included in the user block BLK_U. Since the fourth memory block BLK4 is configured identically to the first to third memory blocks BLK1 to BLK3, the fourth memory block BLK4 may include AA memory cells.

However, since the program operation is performed in the TLC method, all of the first to third data DATA1 to DATA3 may be stored in the fourth memory block BLK4. That is, the fourth memory block BLK4 may include AA memory cells, but may store 3× AA bits of data.

Figure 8F:
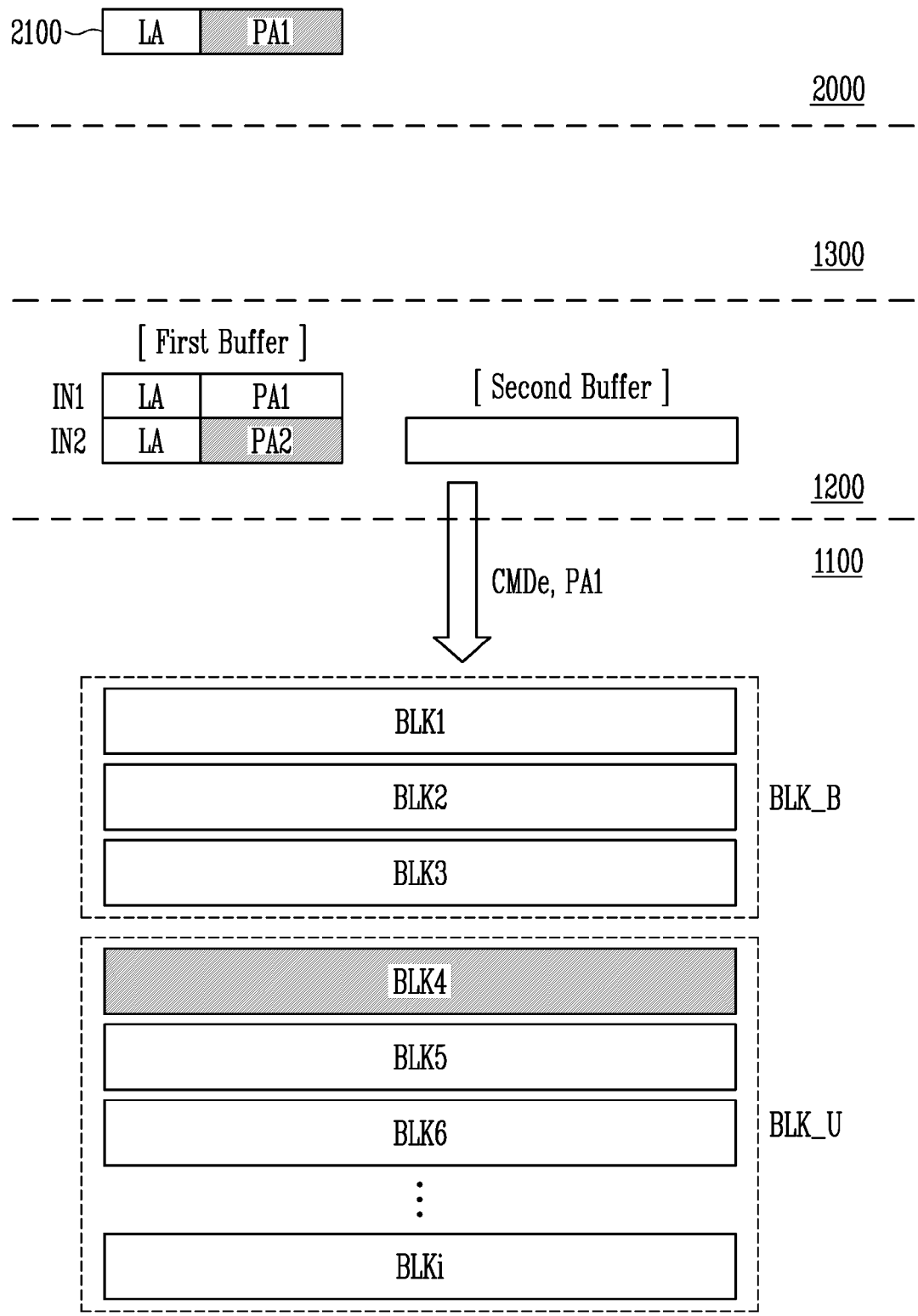

Referring to FIG. 8F, when the program operation of the fourth memory block BLK4 is completed, the controller 1300 may initialize the second buffer 52 of the control buffer 1200, and transmit an erase command CMDe and the first physical address PA1 to the memory device 1100.

The memory device 1100 may perform the erase operation of the first to third memory blocks BLK1 to BLK3 included in the boost block BLK_B in response to the erase command CMDe and the first physical address PA1. The erased first to third memory blocks BLK1 to BLK3 may become free blocks, and the migration operation may be ended.

Figure 8G:
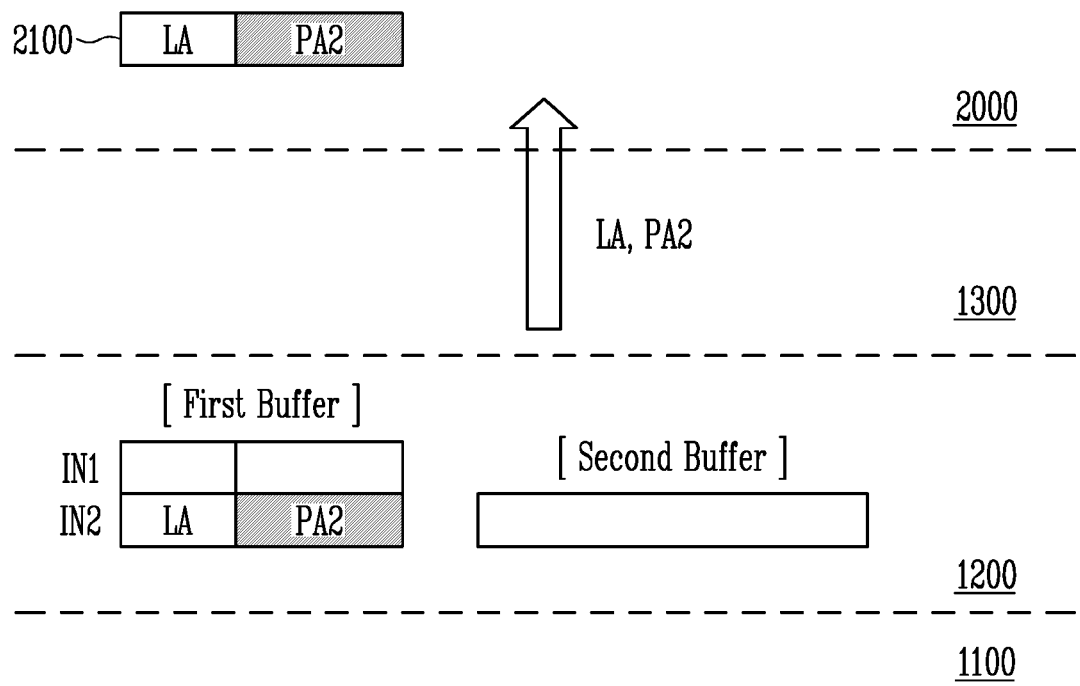
Figure 8G:
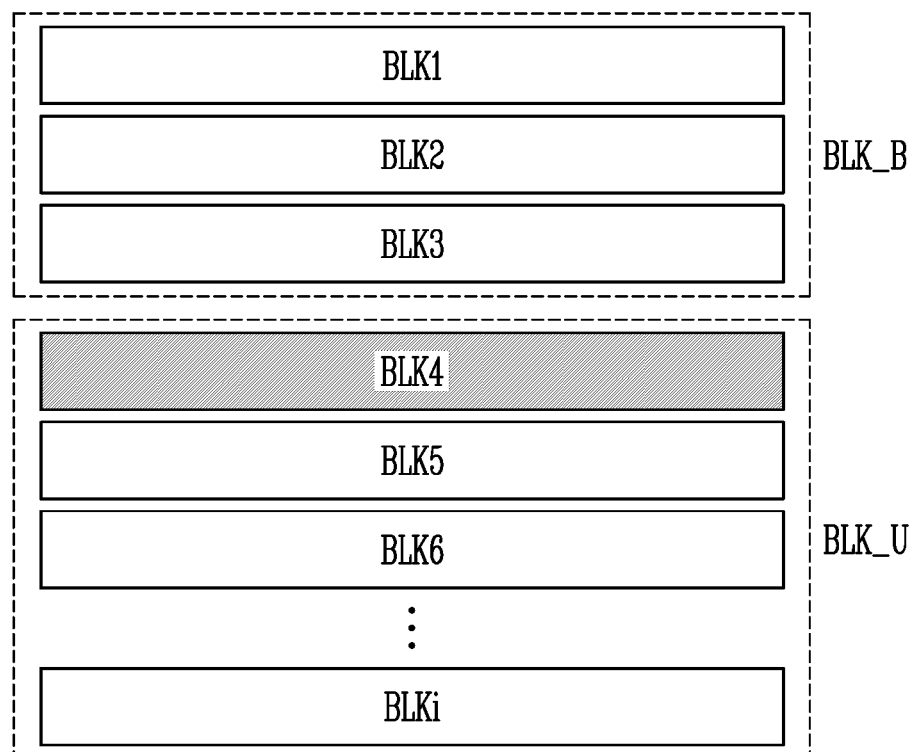

Referring to FIG. 8G, the controller 1300 may initialize the region corresponding to the first index IN1 of the first buffer 51, and transmit the logical address LA and the second physical address PA2 stored in the region corresponding to the second index IN2 to the host 2000.

When the logical address LA and the second physical address PA2 are input, the host 2000 may change the first physical address PA1 stored in the region corresponding to the logical address LA in the host buffer 2100 to the second physical address PA2. The second physical address PA2 stored in the host buffer 2100 may be used during the read operation of the logical address LA.

Figure 9:
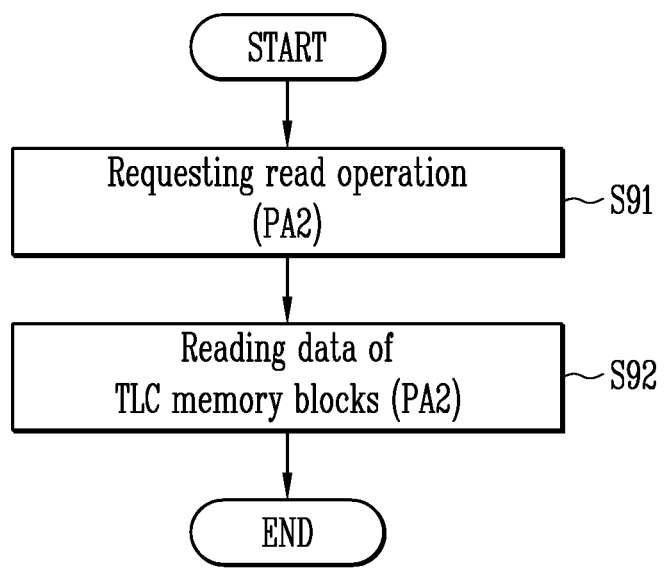
FIG. 9 is a flowchart illustrating a read operation according to an embodiment of the present disclosure.

FIG. 9 is a flowchart illustrating a read operation according to an embodiment of the present disclosure.

Referring to FIG. 9, the host 2000 of FIG. 4 may transmit the read request for the read operation and the second physical address PA2 to the controller 1300 of FIG. 4 (S91). For example, before outputting the read request, the host 2000 may select the logical address LA that becomes a target of the read operation from the host buffer 2100 of FIG. 1, and output the second physical address PA2 mapped to the selected logical address LA.

The controller 1300 may generate the read command used in the memory device 1100 in response to the read request, transmit the read command and the second physical address PA2 to the memory device 1100, and read the data stored in the second physical address PA2 (S92). At this time, since the controller 1300 receives the second physical address PA2 not the logical address LA from the host 2000, an operation of searching for the physical address mapped to the logical address LA may be omitted. Therefore, a time required for the read operation of the memory system including the controller 1300 and the memory device 1100 may be shortened.

Operations performed in the read operation described above are specifically described using the host 2000, the controller 1300, the control buffer 1200, and the memory device 1100 as follows.

Figure 10A:
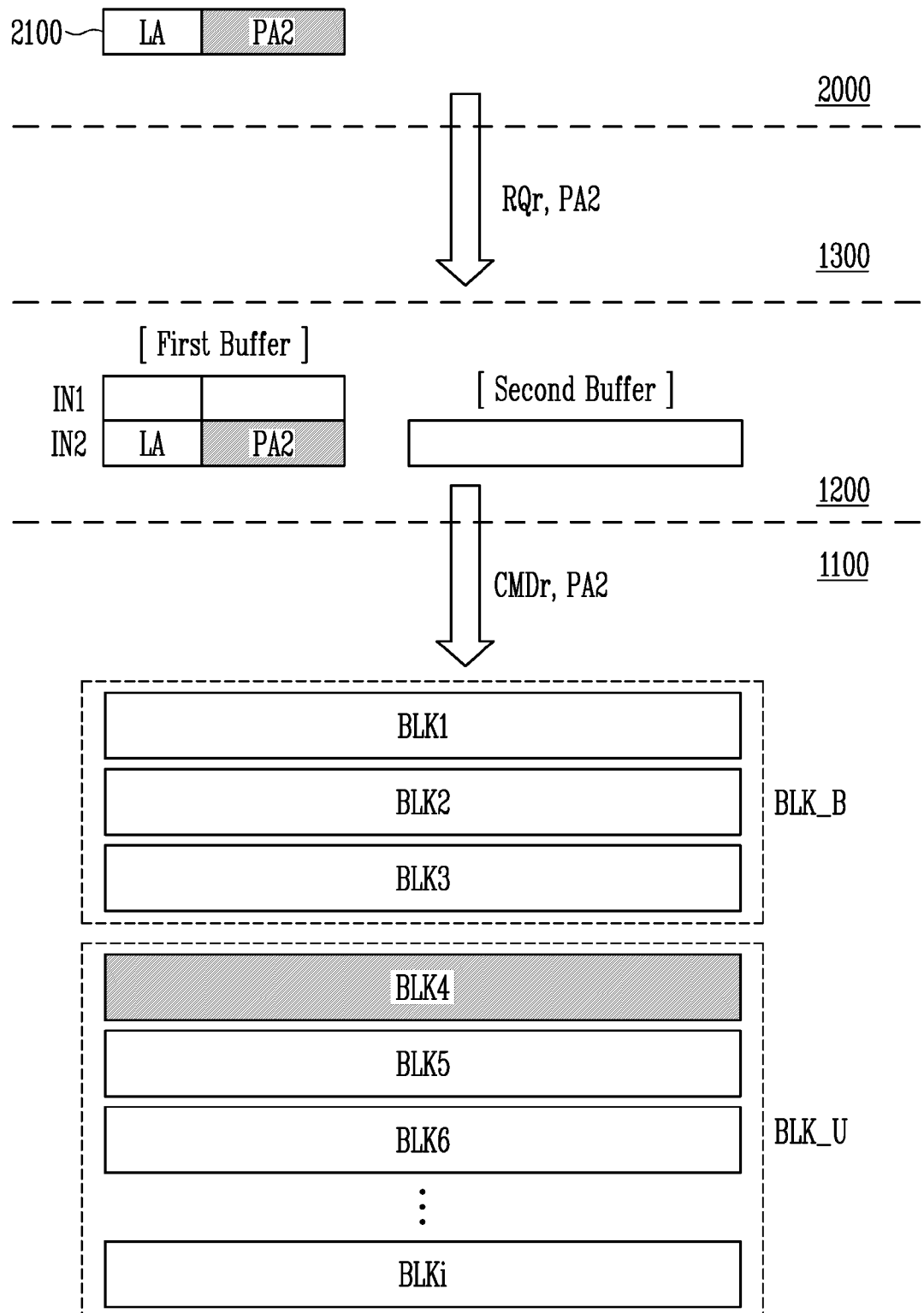
FIGS. 10A and 10B are diagrams illustrating a read operation for each step according to an embodiment of the present disclosure.
Figure 10B:
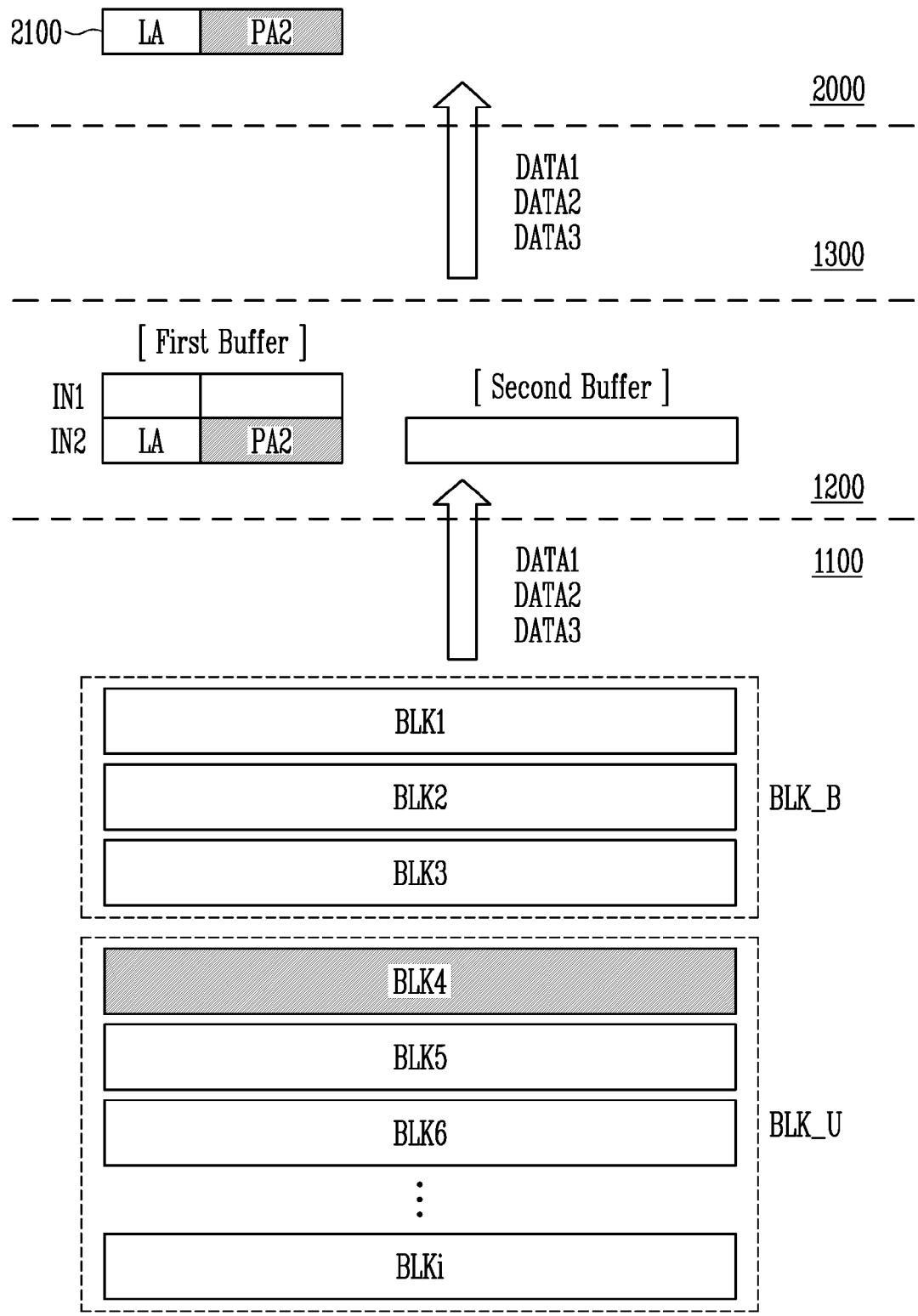

FIGS. 10A and 10B are diagrams illustrating a read operation for each step according to an embodiment of the present disclosure.

Referring to FIG. 10A, the host 2000 may transmit a read request RQr and the second physical address PA2 to the controller 1300.

The controller 1300 may generate the read command CMDr according to the read request RQr. The read command CMDr generated according to the request of the host 2000 may be the command of the TLC method. The controller 1300 may transmit the read command CMDr and the second physical address PA2 to the memory device 1100.

Referring to FIG. 10B, the memory device 1100 may perform the read operation of the user block BLK_U corresponding to the second physical address PA2 in response to the read command CMDr. For example, the memory device 1100 may select the fourth memory block BLK4 included in the user block BLK_U according to the second physical address PA2, and perform the read operation of the selected fourth memory block BLK4.

The memory device 1100 may output the first to third data DATA1 to DATA3 read from the fourth memory block BLK4 to the controller 1300.

The controller 1300 may temporarily store the first to third data DATA1 to DATA3 output from the memory device 1100 in the second buffer of the control buffer 1200, and then output the first to third data DATA1 to DATA3 to the host 2000.

Figure 11:
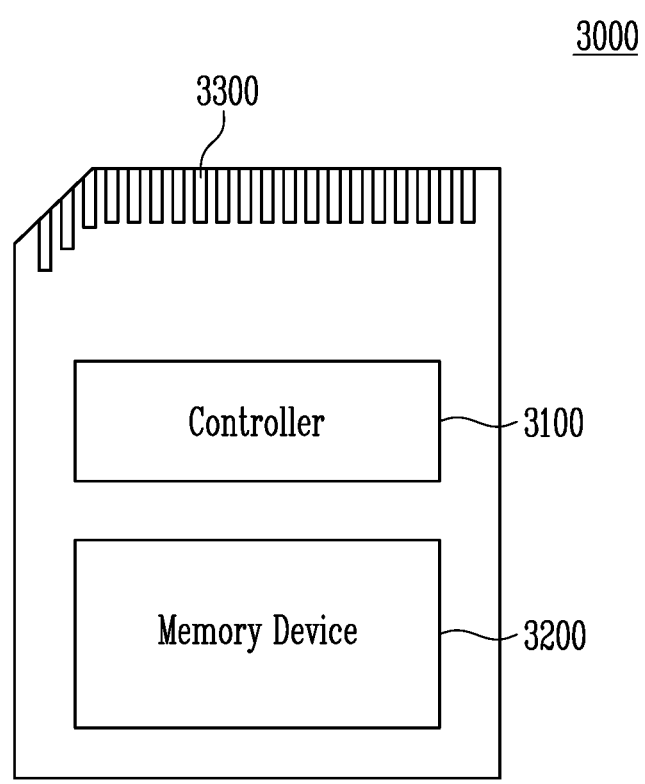
FIG. 11 is a diagram illustrating a memory card system to which a controller of the present disclosure is applied.

FIG. 11 is a diagram illustrating a memory card system 3000 to which a controller of the present disclosure is applied.

Referring to FIG. 11, the memory card system 3000 includes a controller 3100, a memory device 3200, and a connector 3300.

The controller 3100 is connected to the memory device 3200. The controller 3100 is configured to access the memory device 3200. For example, the controller 3100 may be configured to control a program, read, or erase operation of the memory device 3200 or control a background operation. The controller 3100 may be configured identically to the controller 1300 shown in FIG. 4. The controller 3100 is configured to provide an interface between the memory device 3200 and a host. The controller 3100 is configured to drive firmware for controlling the memory device 3200.

For example, the controller 3100 may include components such as a random access memory (RAM), a processor, a host interface, a memory interface, and an error correction circuit.

The controller 3100 may communicate with an external device through the connector 3300. The controller 3100 may communicate with an external device (for example, the host) according to a specific communication standard. For example, the controller 3100 is configured to communicate with an external device through at least one of various communication standards or interfaces such as a universal serial bus (USB), a multimedia card (MMC), an embedded MMC (eMMC), a peripheral component interconnection (PCI), a PCI express (PCI-e or PCIe), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 3300 may be defined by at least one of the various communication standards or interfaces described above.

For example, the memory device 3200 may be configured of various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-transfer torque magnetic RAM (STT-MRAM).

The controller 3100 and the memory device 3200 may be integrated into one semiconductor device to configure a memory card. For example, the controller 3100 and the memory device 3200 may be integrated into one semiconductor device to configure a memory card such as a PC card (i.e., personal computer memory card international association (PCMCIA)), a compact flash card (CF), a smart media card (e.g., SM or SMC), a memory stick, a multimedia card (e.g., MMC, RS-MMC, MMCmicro, or eMMC), a secure digital (SD) card (e.g., SD, miniSD, microSD, or SDHC), and a universal flash storage (UFS).

Figure 12:
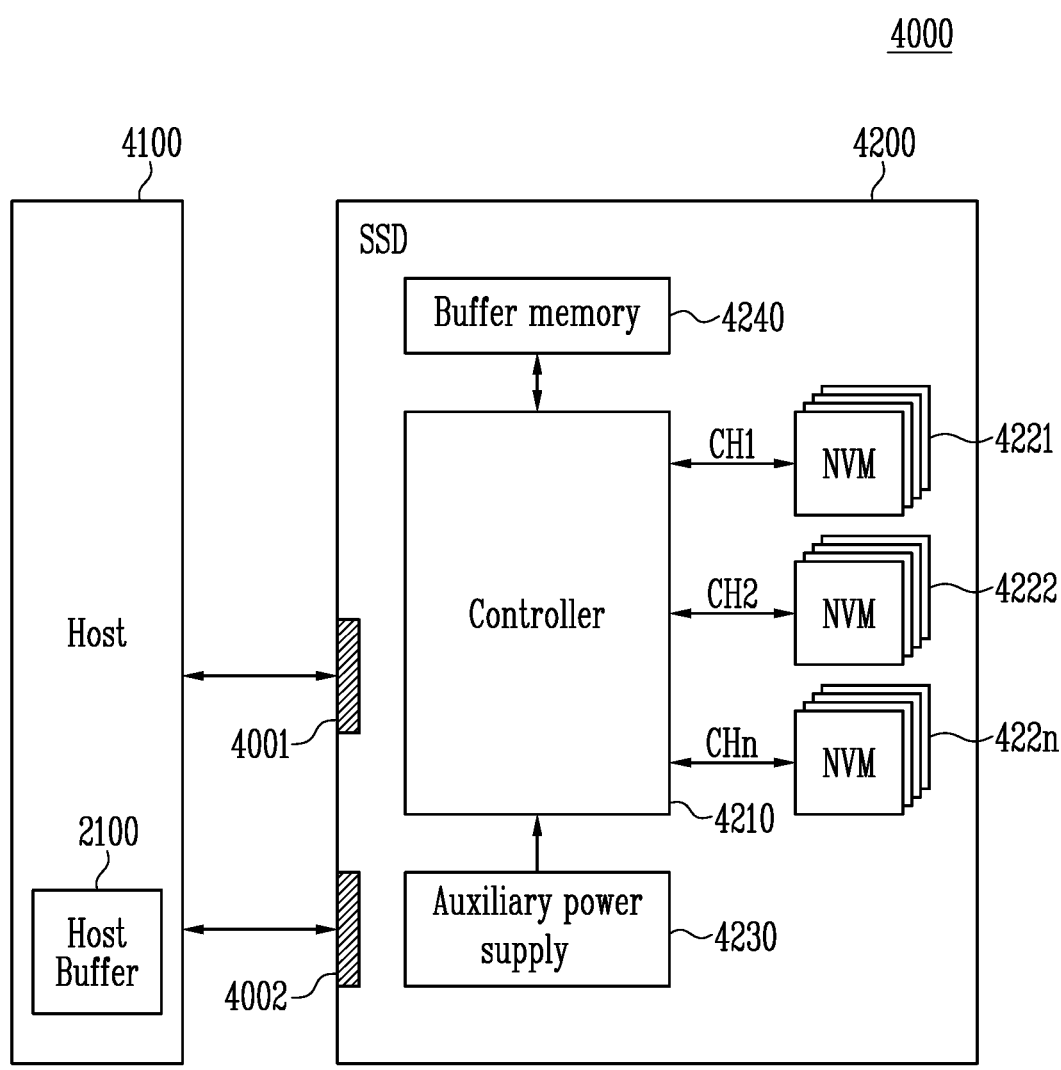
FIG. 12 is a diagram illustrating a solid state drive (SSD) system to which a controller of the present disclosure is applied.

FIG. 12 is a diagram illustrating a solid state drive (SSD) system 4000 to which a controller of the present disclosure is applied.

Referring to FIG. 12, the SSD system 4000 includes a host 4100 and an SSD 4200. The SSD 4200 exchanges a signal SIG with the host 4100 through a signal connector 4001 and receives power PWR through a power connector 4002. The SSD 4200 includes a controller 4210, a plurality of flash memories 4221 to 422n, an auxiliary power supply 4230, and a buffer memory 4240.

According to an embodiment of the present disclosure, the controller 4210 may perform the function of the controller 1300 described with reference to FIG. 4.

The controller 4210 may control the plurality of flash memories 4221 to 422n in response to the signal received from the host 4100. For example, the signal may be signals based on an interface between the host 4100 and the SSD 4200. For example, the signal may be a signal defined by at least one of interfaces such as a universal serial bus (USB), a multimedia card (MMC), an embedded MMC (eMMC), a peripheral component interconnection (PCI), a PCI express (PCI-e or PCIe), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power supply 4230 is connected to the host 4100 through the power connector 4002. The host 4100 may include the host buffer 2100 shown in FIG. 1, and may store the logical address and the physical address in the host buffer 2100. The auxiliary power supply 4230 may receive a power voltage from the host 4100 and may charge the power voltage. The auxiliary power supply 4230 may provide a power voltage of the SSD 4200 when power supply from the host 4100 is not smooth. For example, the auxiliary power supply 4230 may be positioned in the SSD 4200 or may be positioned outside the SSD 4200. For example, the auxiliary power supply 4230 may be positioned on a main board and may provide auxiliary power to the SSD 4200.

The buffer memory 4240 operates as a buffer memory of the SSD 4200. For example, the buffer memory 4240 may temporarily store data received from the host 4100 or data received from the plurality of flash memories 4221 to 422n, or may temporarily store metadata (for example, a mapping table) of the flash memories 4221 to 422n. The buffer memory 4240 may include a volatile memory such as a DRAM, an SDRAM, a DDR SDRAM, and an LPDDR SDRAM, or a nonvolatile memory such as an FRAM, a ReRAM, an STT-MRAM, and a PRAM.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all operations may be selectively performed or part of the operations may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Moreover, the embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

What is claimed is:

1. An electronic system comprising:
    a host configured to output a program request, a logical address, and data; and
    a memory system configured to map the logical address to a first physical address, program the data to first memory blocks corresponding to the first physical address in a single level cell (SLC) method, map the logical address from the first physical address to a second physical address, migrate the data stored in the first memory blocks to a second memory block corresponding to the second physical address in a higher level cell method than the SLC method, and transmit the second physical address to the host, wherein the host outputs a read request for acquiring the data and the second physical address to the memory system, and wherein the memory system, in response to the read request, selects the second memory block stored in the data corresponding to the read request based on the second physical address received from the host, and provides the data read from the second memory block to the host.

2. The electronic system of claim 1, wherein the host includes a host buffer configured to store the logical address and a physical address corresponding to the logical address.

3. The electronic system of claim 1, wherein the memory system comprises:
  a controller configured to generate a program command of the SLC method or generate a program command of the higher level cell method, and map the logical address and the first or second physical address to each other;
  a control buffer configured to store the logical address and the first physical address or the second physical address and temporarily store the data; and
  a memory device including a first set of memory blocks to which the first physical address is allocated and a second set of memory blocks to which the second physical address is allocated.

4. The electronic system of claim 3, wherein the controller is configured to perform a migration operation for moving the data stored in the first set of memory blocks to the second set of memory blocks, when a request from the host does not exist, the memory system is in an idle state, or a free block does not exist among the memory blocks to which the first physical address is allocated.

5. The electronic system of claim 4, wherein the controller is configured to map the second physical address to the logical address, and store the logical address and the second physical address in the control buffer, when the migration operation is started.

6. The electronic system of claim 5, wherein the controller is configured to transmit a read command and the first physical address to the memory device, and to temporarily store read data in the control buffer when read data is output from the memory device.

7. The electronic system of claim 6, wherein the controller outputs the read command of the SLC method.

8. The electronic system of claim 6, wherein the controller is configured to transmit the program command of the higher level cell method, the second physical address, and the read data to the memory device.

9. The electronic system of claim 3, wherein the memory device is configured to program the data in the second set of memory blocks in response to the program command of the higher level cell method and the second physical address.

10. The electronic system of claim 9, wherein the controller is configured to transmit the first physical address and an erase command for erasing the first set of memory blocks to the memory device, when a program operation of the second set of memory blocks is ended.

11. The electronic system of claim 10, wherein the controller is configured to erase the first physical address stored in the control buffer, when an erase operation of the first set of memory blocks is ended.

12. The electronic system of claim 1, wherein the host is configured to change the first physical address mapped to the logical address to the second physical address, when the second physical address is output from the memory system.

13. An electronic system comprising:
  a host configured to output a program request for first to N-th data; and
  a memory system configured to program the first to N-th data to boost blocks in response to the program request, transmit a first physical address corresponding to the boost blocks to the host, and transmit, to the host, a second physical address corresponding to a user block when the first to N-th data stored in the boost blocks are transferred to the user block,
  wherein the host transmits a read request for acquiring the first to N-th data and the second physical address to the memory system when the second physical address is received after storing the first physical address, and
  wherein the memory system, in response to the read request, selects the user block stored in the first to N-th data corresponding to the read request based on the second physical address received from the host, and provides the first to N-th data read from the user block to the host.

14. The electronic system of claim 13, wherein the memory system comprises:
  a control buffer configured to store the first physical address or the second physical address;
  a controller configured to generate a program command in response to the program request, map the first physical address to a logical address, and store the mapped logical address and the first physical address in the control buffer; and
  a memory device configured to store the first to N-th data.

15. The electronic system of claim 14, wherein the controller is configured to output a program command of single level cell (SLC) method to program the first to N-th data to the boost blocks, and output a program command of a higher level cell method including a multi-level cell (MLC) method, a triple level cell (TLC) method, or a quadruple level cell (QLC) method to program the first to N-th data in the user block.

16. The electronic system of claim 14, wherein the controller is configured to move the first to N-th data stored in the boost blocks to the user block when a request from the host does not exist, the memory system is in an idle state, or a free block does not exist in the boost blocks, store the second physical address in the control buffer when the first physical address is changed to the second physical address according to the movement of the first to N-th data, and transmit the second physical address newly stored in the control buffer to the host.

17. The electronic system of claim 14, wherein the boost blocks and the user blocks are configured identically to each other.

18. An electronic system comprising:
  a host configured to output a program request for data; and
  a memory system configured to store the data in first memory blocks, and compress and migrate the data stored in the first memory blocks to a second memory block other than the first memory blocks,
  wherein the memory system transmits a first physical address corresponding to the first memory blocks according to the program request to the host, and provides a second physical address corresponding to the second memory block to the host after compressing and migrating the data, wherein the host is configured to output, to the memory system, a read request for acquiring the data and the second physical address, and wherein the memory system, in response to the read request, selects the second memory block stored in the data corresponding to the read request based on the second physical address received from the host, and provides the data read from the second memory block to the host.

19. The electronic system of claim 18, wherein the memory system is configured to provide the first physical address to the host after storing the first physical address corresponding to the first memory blocks in which the data is stored, during a first program operation performed in response to the program request, and to store the second physical address and provide the second physical address to the host during a second program operation for compressing the data to the second memory block.

20. The electronic system of claim 19, wherein the memory system is configured to perform the first program operation in a single level cell (SLC) method, and perform the second program operation in a multi-level cell (MLC) method, triple level cell (TLC) method, or quadruple level cell (QLC) method.

* * * * *